(12) United States Patent
Takahashi et al.

(10) Patent No.: US 9,847,249 B2
(45) Date of Patent: Dec. 19, 2017

(54) BURIED ETCH STOP LAYER FOR DAMASCENE BIT LINE FORMATION

(71) Applicant: SANDISK TECHNOLOGIES LLC, Plano, TX (US)

(72) Inventors: Yuji Takahashi, Yokkaichi (JP); Takuya Futase, Nagoya (JP); Noritaka Fukuo, Yokkaichi (JP); Katsuo Yamada, Yokkaichi (JP); Tomoyasu Kakegawa, Yokkaichi (JP)

(73) Assignee: SANDISK TECHNOLOGIES LLC, Plano, TX (US)

(*) Notice: Subject to any disclaimer, the term of this patent is extended or adjusted under 35 U.S.C. 154(b) by 330 days.

(21) Appl. No.: 14/533,846

(22) Filed: Nov. 5, 2014

(65) Prior Publication Data

US 2016/0126179 A1 May 5, 2016

(51) Int. Cl.
| | | |
|---|---|---|
| H01L 21/02 | (2006.01) | |
| H01L 21/311 | (2006.01) | |
| H01L 21/768 | (2006.01) | |
| H01L 27/1157 | (2017.01) | |
| H01L 27/11524 | (2017.01) | |

(52) U.S. Cl.
CPC ...... *H01L 21/7682* (2013.01); *H01L 21/0217* (2013.01); *H01L 21/02266* (2013.01); *H01L 21/76802* (2013.01); *H01L 21/76829* (2013.01); *H01L 27/1157* (2013.01); *H01L 27/11524* (2013.01); *H01L 2924/0002* (2013.01)

(58) Field of Classification Search
CPC ......... H01L 21/76264; H01L 21/76289; H01L 21/764; H01L 21/7682; H01L 21/76801–21/76802; H01L 21/7688; H01L 21/76834; H01L 21/02164; H01L 21/0217; H01L 21/76849; H01L 23/481; H01L 21/76877; H01L 2924/0002
See application file for complete search history.

(56) References Cited

U.S. PATENT DOCUMENTS

| | | | |
|---|---|---|---|
| 6,080,664 A * | 6/2000 | Huang | H01L 21/76816 257/760 |
| 6,198,122 B1 * | 3/2001 | Habu | H01L 27/10894 257/296 |
| 7,737,015 B2 | 6/2010 | Kohli et al. | |
| 7,795,080 B2 | 9/2010 | Orimoto et al. | |
| 7,800,155 B2 | 9/2010 | Matsuno | |
| 7,863,190 B1 | 1/2011 | Papasouliotis | |
| 7,884,415 B2 | 2/2011 | Nagano | |
| 7,905,959 B2 | 3/2011 | Tzu et al. | |
| 8,053,347 B2 | 11/2011 | Kang et al. | |
| 8,129,264 B2 | 3/2012 | Kim et al. | |
| 8,362,542 B2 | 1/2013 | Kang et al. | |
| 8,383,479 B2 * | 2/2013 | Purayath | B82Y 10/00 257/E21.691 |
| 8,492,224 B2 | 7/2013 | Purayath et al. | |
| 8,546,239 B2 | 10/2013 | Harari et al. | |
| 8,603,890 B2 | 12/2013 | Purayath et al. | |

(Continued)

*Primary Examiner* — Maliheh Malek
(74) *Attorney, Agent, or Firm* — Foley & Lardner LLP

(57) ABSTRACT

A stack of layers is formed that includes first, second, and third dielectric layers. Contact plugs are then formed extending through the stack. Then a fourth dielectric layer is formed over the stack and contact plugs and trenches are formed through the fourth and third dielectric layers, extending to the second dielectric layer and exposing contact plugs.

9 Claims, 9 Drawing Sheets

(56) References Cited

U.S. PATENT DOCUMENTS

| | | |
|---|---|---|
| 9,287,198 B2 * | 3/2016 | Yang ................... H01L 23/481 |
| 9,330,960 B2 * | 5/2016 | Cho ..................... H01L 21/764 |
| 9,362,422 B2 * | 6/2016 | Lim ....................... H01L 29/94 |
| 9,401,305 B2 * | 7/2016 | Takahashi |
| 2005/0040448 A1 * | 2/2005 | Park .................. H01L 21/02063 257/296 |
| 2006/0194390 A1 | 8/2006 | Imai et al. |
| 2006/0284231 A1 * | 12/2006 | Natsume ........... H01L 21/76801 257/306 |
| 2007/0037398 A1 * | 2/2007 | Kim .................. H01L 21/31144 438/720 |
| 2007/0184615 A1 | 8/2007 | Brazzelli et al. |
| 2007/0257305 A1 | 11/2007 | Sasago et al. |
| 2007/0259516 A1 * | 11/2007 | Jahnes ................ H01L 21/7682 438/618 |
| 2008/0003743 A1 * | 1/2008 | Lee ................... H01L 27/11521 438/257 |
| 2008/0038934 A1 * | 2/2008 | Vrtis ................. H01L 21/02115 438/759 |
| 2008/0099876 A1 * | 5/2008 | Seto ................... H01L 21/7682 257/522 |
| 2008/0254600 A1 * | 10/2008 | Liu ..................... H01L 21/7682 438/494 |
| 2008/0283898 A1 | 11/2008 | Kuniya |
| 2009/0212352 A1 | 8/2009 | Aoyama et al. |
| 2009/0263951 A1 * | 10/2009 | Shibata ............. H01L 21/76816 438/422 |
| 2009/0267131 A1 | 10/2009 | Nitta |
| 2009/0298282 A1 * | 12/2009 | Yun ................... H01L 21/7682 438/653 |
| 2010/0019311 A1 | 1/2010 | Sato et al. |
| 2010/0127320 A1 | 5/2010 | Nishihara et al. |
| 2010/0130001 A1 * | 5/2010 | Noguchi ........... H01L 21/76811 438/627 |
| 2010/0190337 A1 * | 7/2010 | Lee ................... H01L 21/7682 438/666 |
| 2010/0230741 A1 | 9/2010 | Choi et al. |
| 2011/0057250 A1 | 3/2011 | Higashi |
| 2011/0115088 A1 * | 5/2011 | Lo ....................... H01L 23/5329 257/741 |
| 2011/0165750 A1 * | 7/2011 | Yang ................. H01L 21/02164 438/287 |
| 2011/0237043 A1 * | 9/2011 | Kim .................. H01L 27/10852 438/381 |
| 2011/0303967 A1 | 12/2011 | Harari et al. |
| 2011/0309430 A1 | 12/2011 | Purayath et al. |
| 2012/0032344 A1 * | 2/2012 | Usami ............... H01L 21/76807 257/774 |
| 2012/0040527 A1 * | 2/2012 | Kim .................. H01L 21/76804 438/667 |
| 2012/0058639 A1 * | 3/2012 | Sim .................... H01L 21/7682 438/666 |
| 2012/0168203 A1 * | 7/2012 | Srivastava .......... H01L 21/0273 174/250 |
| 2012/0241837 A1 * | 9/2012 | Takashima ........ H01L 27/11524 257/316 |
| 2012/0280300 A1 * | 11/2012 | Kim .................... H01L 21/7682 257/315 |
| 2013/0119550 A1 * | 5/2013 | Hayashi ............ H01L 21/76885 257/773 |
| 2013/0187220 A1 * | 7/2013 | Surthi .................... H01L 21/764 257/329 |
| 2013/0207267 A1 * | 8/2013 | Rho .................. H01L 21/76846 257/751 |
| 2013/0267088 A1 * | 10/2013 | Baek ................. H01L 21/76802 438/637 |
| 2014/0124881 A1 * | 5/2014 | Kwon ...................... H01L 43/08 257/421 |
| 2014/0239363 A1 * | 8/2014 | Pan ..................... H01L 27/0629 257/306 |
| 2015/0028492 A1 * | 1/2015 | Jung ................. H01L 27/10888 257/774 |
| 2015/0037980 A1 * | 2/2015 | Rha ....................... H01L 21/306 438/700 |
| 2015/0091186 A1 * | 4/2015 | Yang ..................... H01L 23/481 257/774 |
| 2015/0228582 A1 * | 8/2015 | Sel ...................... H01L 21/7682 257/751 |
| 2015/0332953 A1 * | 11/2015 | Futase ................ H01L 21/7682 438/421 |
| 2016/0035738 A1 * | 2/2016 | Kakegawa ........ H01L 21/31111 257/314 |
| 2016/0043163 A1 * | 2/2016 | Seo ........................ C23C 16/401 438/396 |
| 2016/0064281 A1 * | 3/2016 | Izumi ................ H01L 21/76897 257/315 |
| 2016/0111326 A1 * | 4/2016 | Ohori ................ H01L 21/76843 438/653 |
| 2016/0111493 A1 * | 4/2016 | Yamada ............ H01L 29/0653 257/315 |
| 2016/0126130 A1 * | 5/2016 | Takahashi .......... H01L 21/7682 257/774 |
| 2016/0126179 A1 * | 5/2016 | Takahashi ............ H01L 23/528 257/774 |
| 2016/0155659 A1 * | 6/2016 | Yang ..................... H01L 23/481 438/269 |
| 2016/0204059 A1 * | 7/2016 | Fukuo ............... H01L 21/76802 257/751 |
| 2016/0225912 A1 * | 8/2016 | Cao ........................ H01L 29/786 |
| 2016/0336335 A1 * | 11/2016 | Akimoto ........... H01L 27/11524 |
| 2017/0025354 A1 * | 1/2017 | Watanabe ............. H01L 23/535 |

* cited by examiner

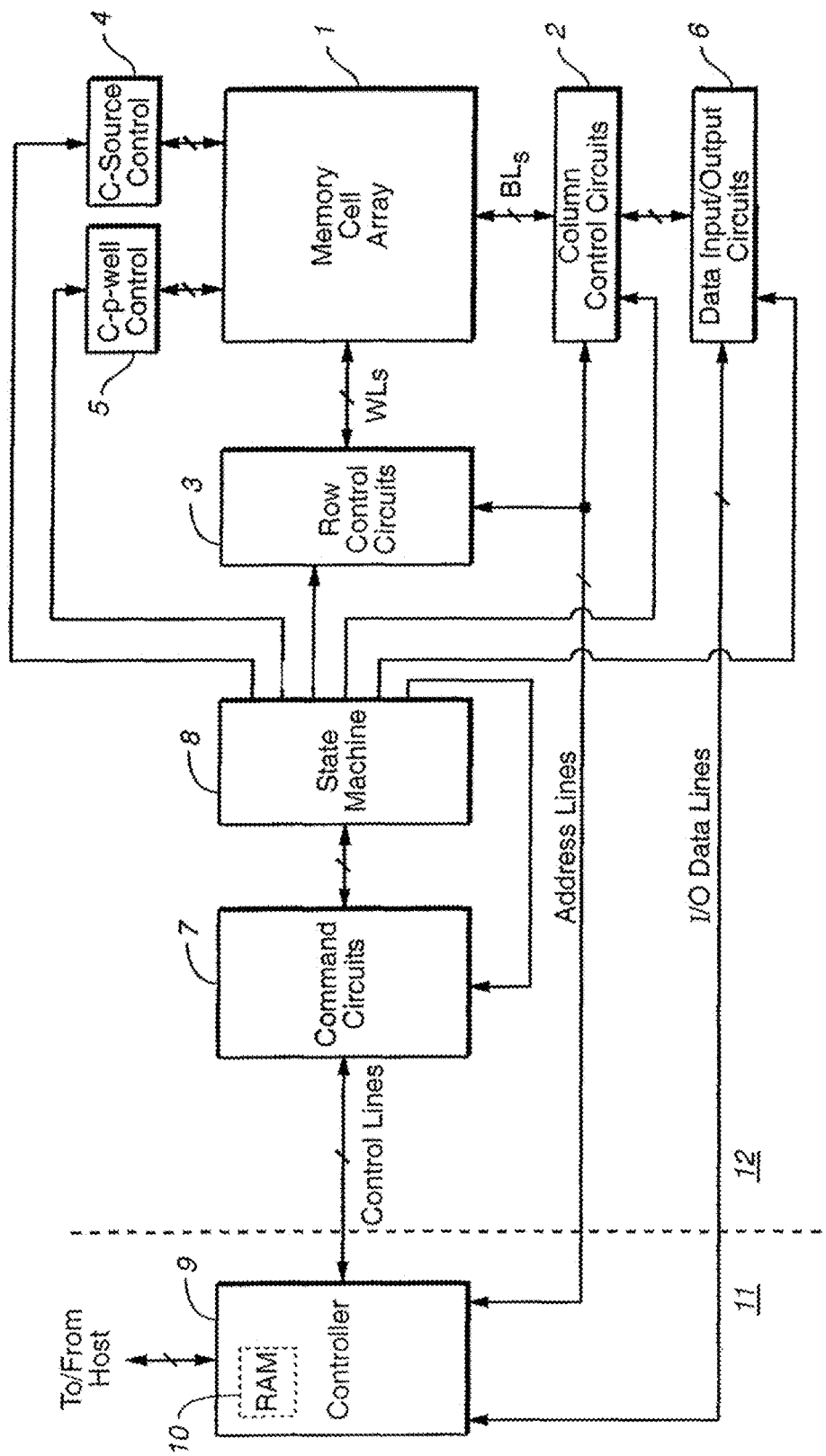
FIG. _1
*(Prior Art)*

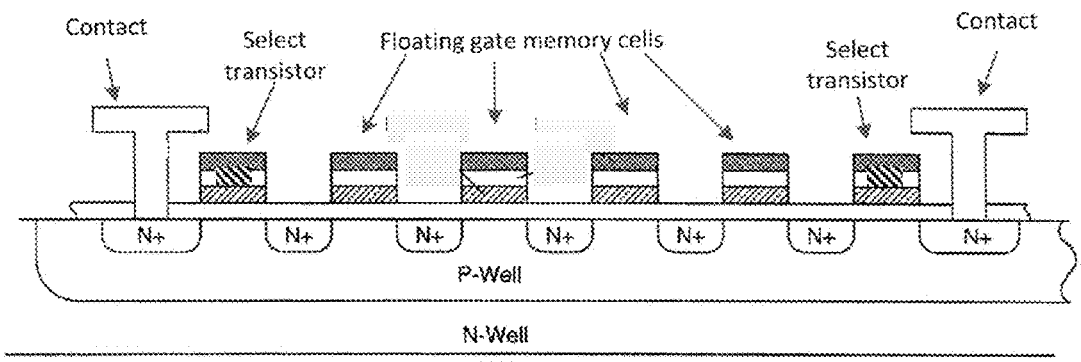
FIG._2B (PRIOR ART)
(Section A-A)
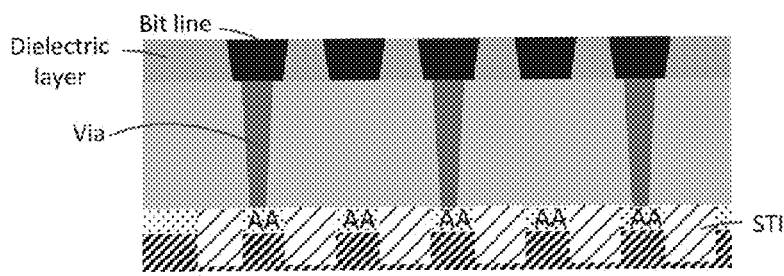
FIG. 2C (Prior Art)
(Section B-B)
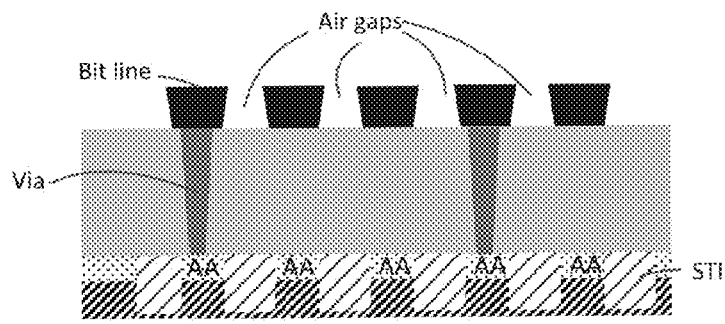
FIG. 3

BURIED ETCH STOP LAYER FOR DAMASCENE BIT LINE FORMATION

BACKGROUND

This application relates generally to non-volatile semiconductor memories of the flash memory type, their formation, structure and use.

There are many commercially successful non-volatile memory products being used today, particularly in the form of small form factor cards, USB drives, embedded memory, and Solid State Drives (SSDs) which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. Although four floating gate memory cells are shown in each string, the individual strings typically include 16, 32 or more memory cell charge storage elements, such as floating gates, in a column. Control gate (word) lines labeled WL0-WL3 and string selection lines, Drain Select Line, "DSL" and Source Select Line "SSL" extend across multiple strings over rows of floating gates. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

The top and bottom of the string connect to the bit line and a common source line respectively through select transistors (source select transistor and drain select transistor). Select transistors do not contain floating gates and are used to connect NAND strings to control circuits when they are to be accessed, and to isolate them when they are not being accessed.

NAND strings are generally connected by conductive lines in order to form arrays that may contain many NAND strings. At either end of a NAND string a contact area may be formed. This allows connection of the NAND string as part of the array. Metal contact plugs (or "vias") may be formed over contact areas to connect the contact areas (arid thereby connect NAND strings) to conductive metal lines that extend over the memory array (e.g. bit lines). FIG. 2A shows bit line contacts BL0-BL4 and common source line contacts at either end of NAND strings. Contacts to contact areas may be formed by etching contact holes through a dielectric layer and then filling the holes with metal to form contact plugs. Metal lines, such as bit lines, extend over the memory array and in peripheral areas in order to connect the memory array and various peripheral circuits. Electrical contact between metal lines and contact plugs occurs where horizontal metal lines intersect vertical contact plugs. These metal lines may be close together (particularly in the memory array area where bit lines may be very close) which tends to make processing difficult and provides a risk of capacitive coupling. The characteristics of such lines (e.g. resistance and coupling) and the quality of connections with contact plugs may be significant factors for good memory operation.

Thus, there is a need for a memory chip manufacturing process that forms uniform low resistance conductive lines, such as bit lines, in close proximity in an efficient manner.

SUMMARY

According to an example of formation of a memory integrated circuit, contact plugs are formed so that they extend above an upper surface of an etch stop layer. A dielectric layer is then deposited over the contact plugs and trenches are formed through the dielectric layer down to the etch stop layer, which provides trenches of uniform depth. Bit lines of uniform height are then formed in these trenches. Dielectric layer material may remain in place to isolate bit lines. Dielectric material may alternatively be removed down to the etch stop layer to provide air gaps of uniform height that occupy substantially all of the volume between bit lines. A capping layer may be deposited over the air gaps to enclose and protect air gaps.

An example of a method of forming a structure includes: forming a first dielectric layer; subsequently forming a second dielectric layer over the first dielectric layer; subsequently forming a third dielectric layer over the second dielectric layer; subsequently forming a contact plug that extends through the first, second, and third dielectric layers; subsequently depositing a fourth dielectric layer on the third dielectric layer and on the contact plug; patterning the fourth dielectric layer and the third dielectric layer such that one or more trenches are formed where one or more conductive lines are to be located, the one or more trenches extending to the second dielectric layer and exposing the contact plug; subsequently forming conductive lines in the one or more trenches; and subsequently depositing a fifth dielectric layer on the conductive lines.

Subsequent to forming the conductive lines in the one or more trenches and prior to depositing the fifth dielectric layer, the third and fourth dielectric layers may be removed between the conductive lines thereby forming air gaps between the conductive lines, the air gaps may subsequently be capped by the fifth dielectric layer. The one or more trenches may extend into the second dielectric layer to a depth that provides adhesion between the second dielectric layer and the subsequently formed conductive lines. The forming of the contact plug may include: (a) forming a contact hole that extends through the first, second, and third dielectric layers; (b) subsequently depositing a conductive material in the contact hole and overlying a surface of the third dielectric layer; and (c) subsequently performing planarization to remove the conductive material overlying the surface of the third dielectric layer and remove an upper portion of the third dielectric layer leaving a lower portion of the third dielectric layer. The second dielectric layer may be formed of silicon nitride, the third dielectric layer may be formed of silicon oxide, and the fourth dielectric layer may be formed of silicon oxide. The second dielectric layer may be a layer deposited by Physical Vapor Deposition (PVD).

An example of a semiconductor device includes: a first dielectric layer; a contact plug that extends through the first dielectric layer in a direction perpendicular to the first dielectric layer, a top surface of the contact plug projecting above an upper surface of the first dielectric layer; a plurality of conductive lines on the first dielectric layer, an individual conductive line located in contact with at least a part of the contact plug; and a second dielectric layer that overlies air gaps formed between conductive lines.

The air gaps may extend lower than the top surface of the contact plug. The first dielectric layer may include: a lower layer formed of silicon oxide; and an upper layer formed of silicon nitride. The plurality of conductive lines may extend into the upper layer, an individual conductive line having a lower surface that is lower than an upper surface of the upper layer.

An example of a semiconductor device includes: a first dielectric layer; a second dielectric layer overlying the first dielectric layer; a contact plug that extends through the first dielectric layer in a direction vertical to the first dielectric layer; a plurality of conductive lines located partially in the second dielectric layer and partially in the first dielectric layer, an individual conductive line contacting the contact plug; and a third dielectric layer that extends over the plurality of conductive lines.

The contact plug may extend above bottom surfaces of the plurality of conductive lines. The first dielectric layer may include: a lower layer formed of silicon oxide; a middle layer formed of silicon nitride; and an upper layer formed of silicon oxide. Bottom surfaces of the plurality of conductive lines may be located at a level that is lower than an interface between the middle layer and the upper layer.

An example of a method of forming bit lines in a NAND memory die includes: forming a dielectric layer; subsequently forming an etch stop layer over the dielectric layer; subsequently forming a first sacrificial layer over the etch stop layer; subsequently forming a contact plug that extends through the sacrificial layer, the etch stop layer, and the dielectric layer; subsequently forming a second sacrificial layer on the first sacrificial layer and on the contact plug; etching a plurality of trenches through the first sacrificial layer and the second sacrificial layer, stopping at the etch stop layer, thereby exposing the contact plug; subsequently forming bit lines in the plurality of trenches; and subsequently removing the first and second sacrificial layers to form air gaps.

The etching may extend trenches below an upper surface of the contact plug by a distance that is greater than a thickness of the first sacrificial layer. A capping layer may be deposited to cap the air gaps. The dielectric layer may be formed of silicon oxide, the etch stop layer may be formed of silicon nitride, the first and second sacrificial layers may be formed of silicon oxide, and the capping layer may be formed of silicon carbon nitride. The etching may be selective to silicon oxide over silicon nitride. The etching may extend the plurality of trenches into the etch stop layer, stopping at a level that is lower than an upper surface of the etch stop layer, thereby providing a recessed surface of the etch stop layer for the subsequently formed bit lines to adhere to.

Various aspects, advantages, features and embodiments are included in the following description of examples, which description should be taken in conjunction with the accompanying drawings.

BRIEF DESCRIPTION OF THE DRAWINGS

FIG. 1 is a block diagram of a prior art memory system.
FIG. 2B shows a cross section of the NAND array of FIG. 2A.
FIG. 2C shows another cross section of the NAND array of FIG. 2A.
FIG. 3 illustrates an example of formation of air gaps between bit lines.

DETAILED DESCRIPTION OF EXEMPLARY EMBODIMENTS

Memory System

Figure 2A:
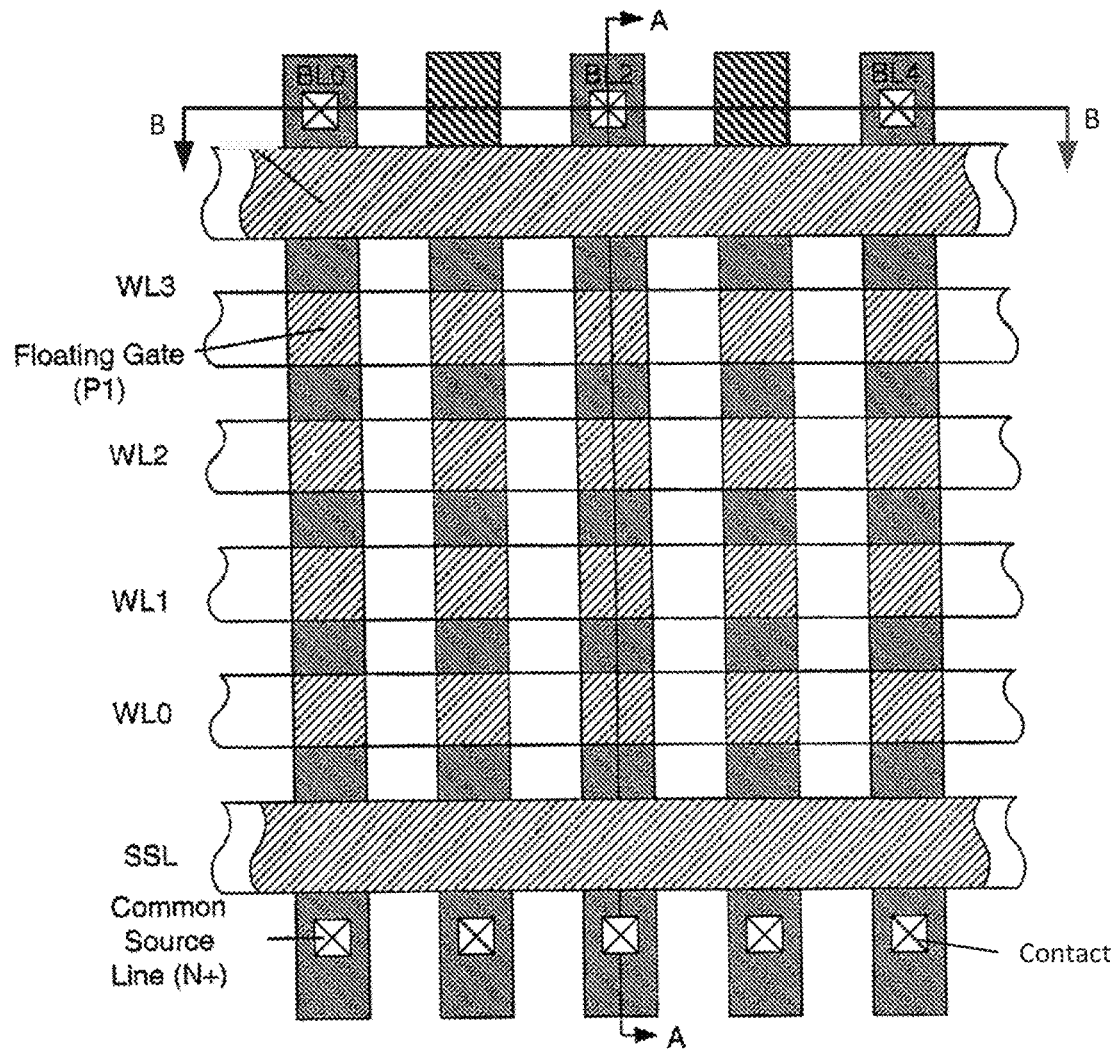
FIG. 2A is a plan view of a prior art NAND array.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to fog n a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

An example of a prior art memory system, which may be modified to include various structures described here, is illustrated by the block diagram of FIG. 1. A planar memory cell array 1 including a plurality of memory cells is controlled by a column control circuit 2, a row control circuit 3, a c-source control circuit 4 and a c-p-well control circuit 5. The memory cell array 1 is, in this example, of the NAND type similar to that described above in the Background and in references incorporated therein by reference. A control circuit 2 is connected to bit lines (BL) of the memory cell array 1 for reading data stored in the memory cells, for determining a state of the memory cells during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells are formed. The c-source control circuit 4 controls a common source line (labeled as "c-source" in FIG. 1) connected to the memory cells (M). The c-p-well control circuit 5 controls the c-p-well voltage.

The data stored in the memory cells are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. The memory system of FIG. 1 may also be used in a Solid State Drive (SSD) or similar unit that provides mass data storage in a tablet, laptop computer, or similar device. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

FIGS. 2A-2C show different views of a prior art NAND flash memory. In particular, FIG. 2A shows a plan view of a portion of such a memory array including bit lines and word lines (this is a simplified structure with a small number of word lines and bit lines). FIG. 2B shows a cross section along A-A (along a NAND string) showing individual memory cells that are connected in series. Contact plugs, or vias, are formed at either end to connect the NAND strings in the memory array to conductive lines (e.g. connecting to bit lines at one end and to a common source line at the other end). Such a contact plug may be formed of metal that is deposited into a contact hole that is formed in a dielectric layer. FIG. 2C shows a cross section along B-B of FIG. 2A. This view shows metal contact plugs extending down through contact holes in a dielectric layer to make contact with active areas ("AA") in the substrate (i.e. with N+ areas of FIG. 2B). STI regions are located between active areas of different strings to electrically isolate an individual NAND string from its neighbors. Bit lines extend over the memory array in a direction perpendicular to the cross section shown. Alternating bit lines are connected to vias in the cross section shown. (It will be understood that other vias, that are not visible in the cross section shown, connect the remaining bit lines to other active areas). In this arrangement, locations of vias alternate so that there is more space between vias and thus less risk of contact between vias. Other arrangements are also possible.

As memories become smaller, the spacing between bit lines tends to diminish. Accordingly, capacitive coupling between bit lines tends to increase as technology progresses to ever-smaller dimensions. FIG. 2C shows an example of bit lines formed in a dielectric material. For example, copper bit lines may be formed by a damascene process in which elongated openings, or trenches, are formed in the dielectric layer and then copper is deposited to fill the trenches. When excess copper is removed (e.g. by Chemical Mechanical Polishing, CMP) copper lines remain. A suitable dielectric may be chosen to keep bit line-to-bit line capacitance low.

One way to reduce bit line-to-bit line coupling is to provide an air gap between neighboring bit lines. Thus, rather than maintain dielectric portions between bit lines, the bit lines are formed in a sacrificial layer which is then removed to leave air gaps between bit lines. FIG. 3 shows a simplified illustration of bit lines that are separated by air gaps. In some cases, air gap structures may not be as simple and may have certain problems. In particular, bit lines may not have uniform dimensions, e.g. height may vary from bit line to bit line. Also, air gaps may only extend partially between bit lines so that there is significant dielectric material between bit lines and the amount of such dielectric material may be nonuniform. This may not reduce bit line to bit line coupling as much as if air gaps extended further and may provide additional variation in bit line to bit line coupling.

Figure 4:
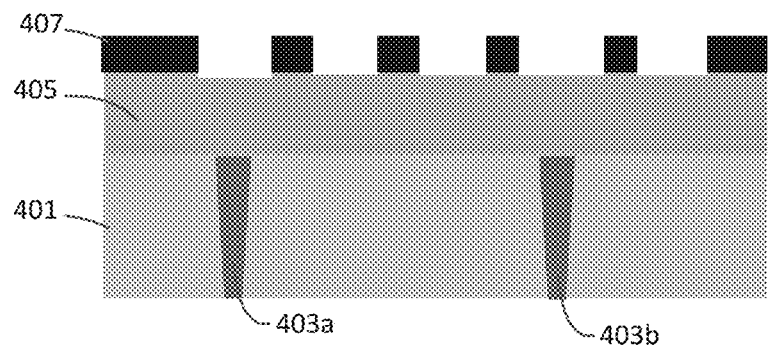
FIGS. 4 shows a cross section of a portion of a NAND memory die at an intermediate stage of fabrication.
Figure 5:
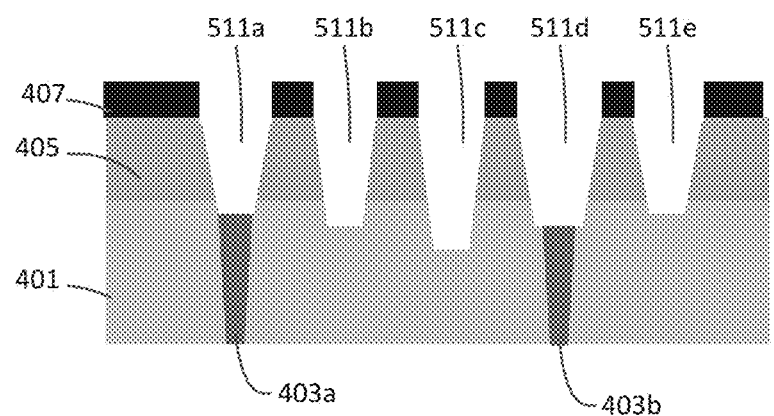
FIG. 5 shows the structure of FIG. 4 after formation of trenches.
Figure 6:
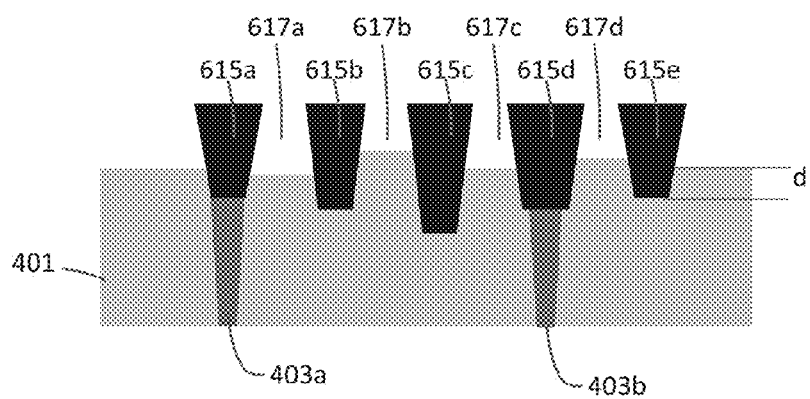
FIG. 6 shows the structure of FIG. 5 after removal of sacrificial material.

FIGS. 4-6 illustrate an example of a process for forming bit lines separated by air gaps. FIG. 4 shows a dielectric layer 401 (e.g. silicon oxide formed using tetraethyl orthosilicate, "TEOS") with contact plugs 403a-b, extending through it and a sacrificial layer 405 (which may also be formed of silicon oxide) overlying the dielectric layer and the vias. Underlying active areas and STI structures are not shown in this view for clarity (it will be understood that a structure like that of FIG. 2C, or another structure may underlie the illustrated portion). Masking portions of a patterned hard mask layer 407 overlie the sacrificial layer 405 and define areas where trenches are to be formed.

FIG. 5 shows the results of etching according to the pattern established by the masking layer 407 of FIG. 4. Trenches 511a-e are formed through sacrificial layer 405 and into the underlying dielectric layer 401. In general, in order to ensure that contact plugs 403a-b are fully exposed, some over-etching may be performed. The depth of trenches may vary somewhat due to normal process variation and so there may be a risk that under-etching could produce a shallow trench that would not fully expose a contact plug. This could lead to a bad contact and an inoperable portion of the memory. Under-etching of some trenches could also result in poor adhesion of bit lines and could lead to lift-off of such bit lines. Therefore, to avoid the risk of under-etching, etching continues to a depth that ensures that all trenches extend into the dielectric layer, i.e. extend below the tops of contact plugs. This may result in some trenches extending significantly into the dielectric layer.

FIG. 6 shows the structure of FIG. 5 after trenches are filled with metal (and barrier material, not separately shown), planarization to remove excess metal, and selective etching to remove sacrificial material leaving bit lines 615a-e. Removal of sacrificial material may be somewhat nonuniform which results in the uneven profile shown. Air gaps 617a-d between bit lines may vary in depth as a result of this nonuniformity so that coupling between bit lines may vary (this variation is in addition to variation in bit line height).

It can be seen that bit lines 615a-e extend a significant distance into the dielectric layer. For example bit line 615e extends a distance d into the dielectric layer. Distance d may be a minimum distance that is considered a minimum to provide bit line adhesion and ensure exposure of contact plugs. This distance may be a minimum that is provided in a worst case scenario of a shallow bit line with deep air gaps on either side. In order to provide at least a minimum overlap=d between bit lines and dielectric and ensure exposure of contacts in such a worst case, other bit lines (e.g.

deep bit lines with shallow air gaps) may have significant dielectric overlap. Extending into the dielectric layer in this way means that air gaps only occupy a portion of the volume between bit lines and dielectric occupies the remaining volume. Coupling between bit lines is thus higher than if air gaps occupied more of the volume between bit lines.

In some cases, an etch stop layer may be used to improve trench depth uniformity and thereby improve bit line height uniformity. FIGS. 7-11 illustrate an example of formation of bit lines separated by air gaps using an etch stop layer.

Figure 7:
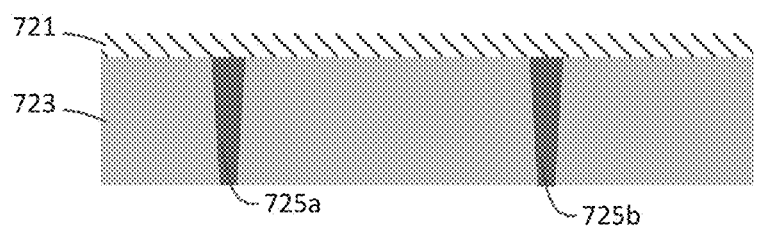
FIG. 7 shows a structure with an etch stop layer overlying dielectric and contact plugs.

FIG. 7 shows an etch stop layer 721 formed over a dielectric layer 723 that contains contact plugs 725*a-b*. An etch stop layer may be formed of any suitable material for which a selective etch chemistry allows selective removal of subsequently deposited sacrificial material. For example, where silicon oxide is used as sacrificial layer material, silicon nitride may be used to form an etch stop layer. An etch stop layer formed of silicon nitride or other material may be formed using any suitable process. For example, silicon nitride may be deposited by Chemical Vapor Deposition (CVD) or Physical Vapor Deposition (PVD), e.g. by sputtering. In general, silicon nitride that is deposited by CVD using source gases that contain hydrogen (e.g. hydrogen in a silane $SiH_4$ molecule) may contain significant hydrogen. Thus, CVD processes using a combination of source gasses such as silane and nitrogen ($SiH_4+N_2$); silane and ammonia ($SiH_4+NH_3$); or silane, nitrogen, and ammonia ($SiH_4+N_2+NH_3$); may result in silicon nitride that incorporates significant hydrogen. Hydrogen may degrade cell reliability and is generally undesirable in such a location. Accordingly a PVD process may be used, or a degassing anneal step may be added after CVD deposition, so that incorporated hydrogen is reduced or eliminated.

Figure 8:
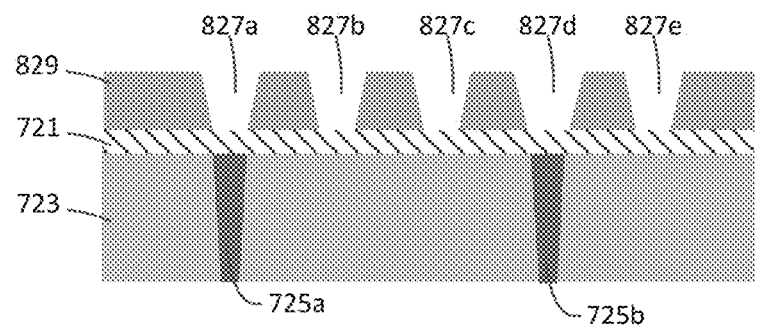
FIG. 8 shows the structure of FIG. 7 after formation of trenches in a sacrificial layer.

FIG. 8 shows trenches 827*a-e* through a sacrificial layer 829 formed over etch stop layer 721. The etching process used to form trenches 827*a-e* may be an anisotropic etch (e.g. Reactive Ion Etching "RIE") that is selective to sacrificial material over etch stop material (e.g. a higher etch rate for silicon oxide than for silicon nitride). Thus, the etching stops at the etch stop layer 721 and provides trenches with substantially uniform depth. However, contact plugs 725*a-b* remain covered by the etch stop layer at this point.

Figure 9:
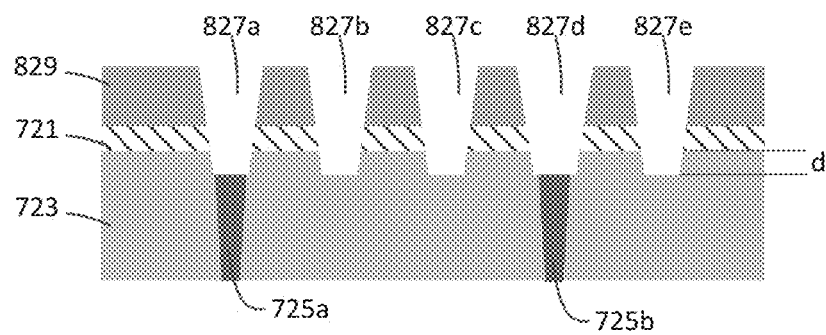
FIG. 9 shows the structure of FIG. 8 after extension of the trenches to expose contact plugs.

FIG. 9 shows the structure of FIG. 8 after further etching that extends trenches 825*a-e* through etch stop layer 721 and into underlying dielectric layer 723. This further etching may use a different etch chemistry for the etch stop material or may continue to use the same etch chemistry at a slower etch rate. This etching extends trenches 827*a-e* a distance d into the underlying dielectric layer 723 in order to ensure that contact plugs 725*a-b* are uncovered.

Figure 10:
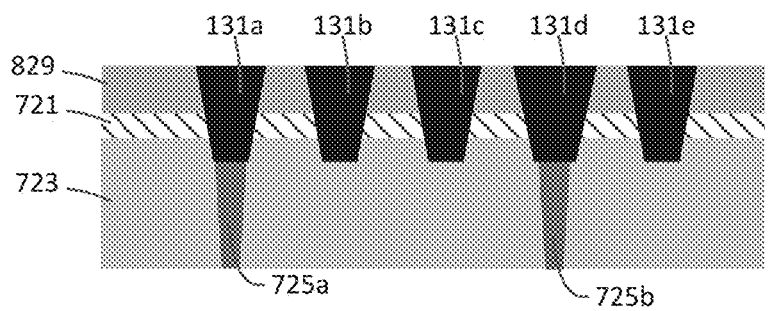
FIG. 10 shows the structure of FIG. 9 after formation of bit lines in trenches.

FIG. 10 shows the structure of FIG. 9 after formation of bit lines 131*a-e* by depositing bit line metal such as copper (and barrier material or materials such as titanium, and/or titanium nitride, which is not separately shown) in trenches 827*a-e* and removal of excess bit line metal, e.g. by Chemical Mechanical Polishing (CMP).

Figure 11:
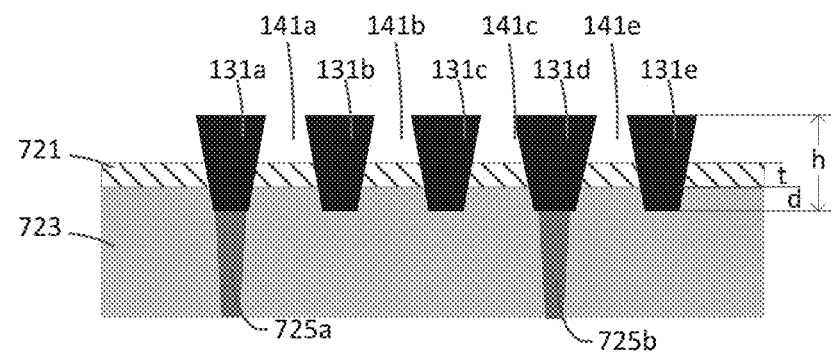
FIG. 11 shows the structure of FIG. 10 after removal of sacrificial material.

FIG. 11 shows the result of removal of sacrificial layer 829 from the structure shown in FIG. 10. This removal stops at etch stop layer 721 and thus provides uniform air gaps. For example, removal of silicon oxide may use a solution of hydrofluoric acid (HF) diluted in water (diluted HF or "DHF"). In contrast to the bit lines of FIG. 6, both bit lines 131*a-e* and air gaps 141*a-d* between bit lines have substantially uniform vertical dimensions in this example. However, it can be seen that air gaps 141*a-d* do not occupy the entire volume between bit lines 131*a-e*. Bit lines have height=h. However, etch stop layer 721 occupies some of the volume between bit lines 131*a-e*. Here, etch stop layer 721 has thickness=t. Bit lines extend into the dielectric a distance=d. Thus, the air gap between bit lines occupies only h−(t+d) of the vertical dimension h, which may be significantly less than h. For example, h may be forty nanometers (40 nm), t may be ten nanometers (10 nm), and d may be ten nanometers (10 nm) so that half the volume between bit lines is occupied by dielectric material (etch stop layer 721 is also formed of dielectric in this example) and only half the volume (20 nm of 40 nm height) is occupied by an air gap.

Figure 12:
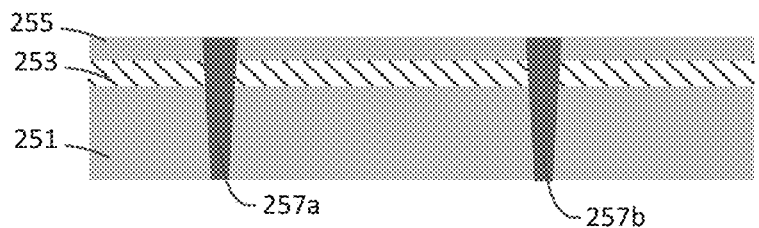
FIG. 12 shows a structure with contact plugs extending above an upper surface of the etch stop layer.

An example of a process that uses a buried etch stop layer is illustrated in FIGS. 12-16. FIG. 12 shows a portion of a die at an intermediate stage of fabrication with a lower dielectric layer 251 (e.g. silicon oxide), an etch stop layer 253 (e.g. silicon nitride, which may also be considered a dielectric), and an upper dielectric layer 255 (e.g. silicon oxide) that form a stack. Contact plugs 257*a-b* extend through the stack and may be formed by etching through the stack of layers and filling the resulting hole with a suitable metal. In contrast to previous examples, the example of FIG. 12 shows contact plugs 257*a-b* extending above the upper surface of etch stop layer 253.

Figure 13:
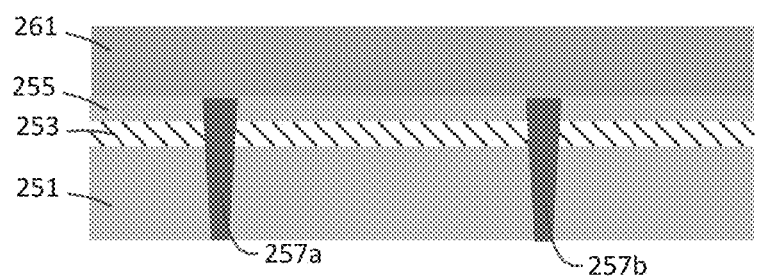
FIG. 13 shows the structure of FIG. 12 after formation of a sacrificial layer.

FIG. 13 shows the structure of FIG. 12 after formation of a sacrificial layer 261 (e.g. silicon oxide) over the second dielectric layer 255 and over the contact plugs 257*a-b*. (In other examples a dielectric layer like sacrificial layer 261 may not be sacrificial and may provide dielectric portions between bit lines in a finished product.)

Figure 14:
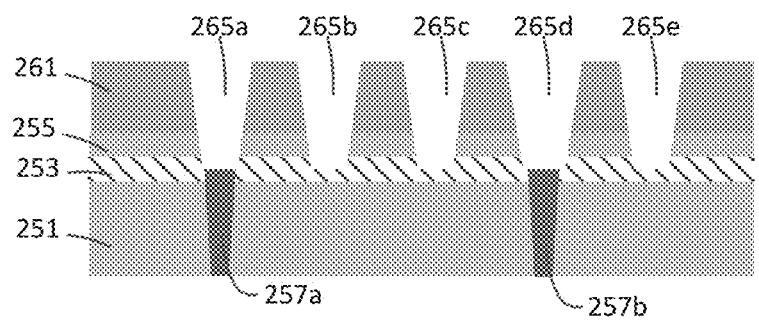
FIG. 14 shows the structure of FIG. 13 after formation of trenches.

FIG. 14 shows the structure of FIG. 13 after etching to form trenches through sacrificial layer 261 and the upper dielectric layer 255, stopping on the etch stop layer 253. Because this etch uses etch stop layer 253, trenches 265*a-e* are formed to a uniform depth. Etching may be performed so that all trenches extend partially into the etch stop layer 253 in order to ensure that no trench has any remaining dielectric material at the bottom. Because trenches are etched to, or beyond the upper surface of etch stop layer 253, and contact plugs 257*a-b* extended above this surface, exposure of tops of contact plugs 257*a-b* is ensured when etching the trenches, i.e. there is sufficient overlap to reduce risk of any trench failing to reach an underlying contact plug.

Figure 15:
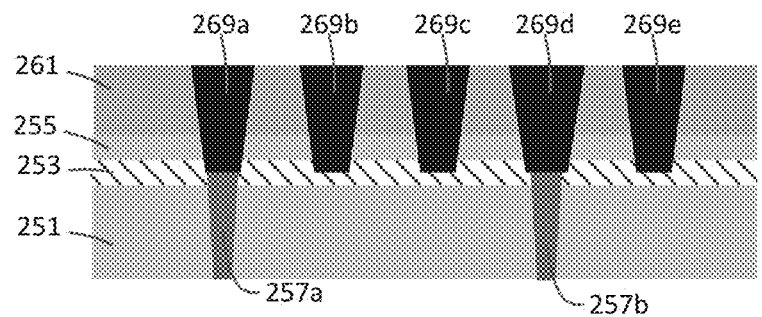
FIG. 15 shows the structure of FIG. 14 after formation of bit lines in trenches.

FIG. 15 shows the structure of FIG. 14 after formation of bit lines 269*a-e* in the trenches. It can be seen that bit lines 269*a-e* have a uniform height and that bit lines 269*a-e* lie in contact with contact plugs 257*a-b* (i.e. no dielectric or other material lies between them). In some cases, dielectric material may be maintained between bit lines 269*a-e* in the final product so that material between bit lines is not removed (i.e. a layer like sacrificial layer 261 may not be "sacrificial" in some cases and may remain in the finished product). In other cases, it is desirable to form air gaps between bit lines, in which case material between bit lines is removed.

Figure 16:
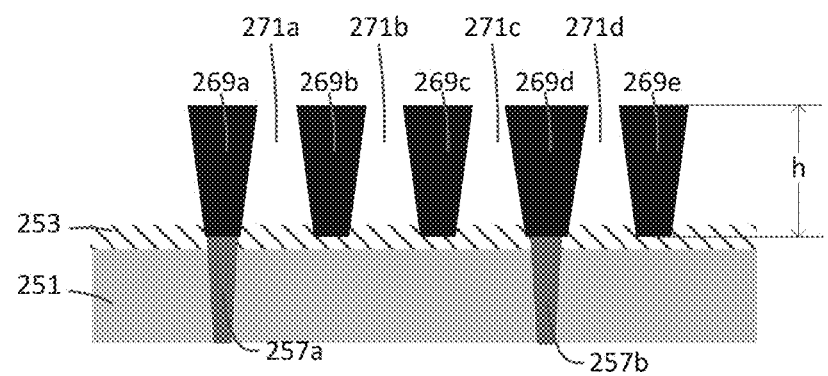
FIG. 16 shows the structure of FIG. 15 after etching.

FIG. 16 shows the structure of FIG. 15 after removal of sacrificial material 261 and upper dielectric material 255 down to the level of the upper surface of the etch stop layer 253. It can be seen that air gaps 271*a-d* have a uniform height because their lower surface is established by the upper surface of the etch stop layer 253 (with some indentation into etch stop layer 253). Bit lines 269*a-e* have a height h and air gaps 271*a-d* have a height that is slightly less than h (due to indentations into etch stop layer 253). Air gaps 271*a-d* thus occupy substantially all of the volume between bit lines 269*a-e* (e.g. more than 90%, or more than 80%) and thereby provide good isolation and reduce bit line to bit line coupling. (This removal step may be considered optional and in some cases dielectric, e.g. silicon oxide, remains between bit lines in a finished product. This can provide low coupling between neighboring bit lines because silicon oxide has a high dielectric constant compared with some other materials such as silicon nitride or a combination of silicon nitride and silicon oxide. Thus, such single-dielectric isolation between bit lines may be used as an alternative to air gaps. The etch stop layer remains under bit lines and dielectric portions in this case.) It can be seen that this provides a significant improvement in air gap coverage between bit lines (from about half to substantially all of the volume between bit lines).

Figure 17:
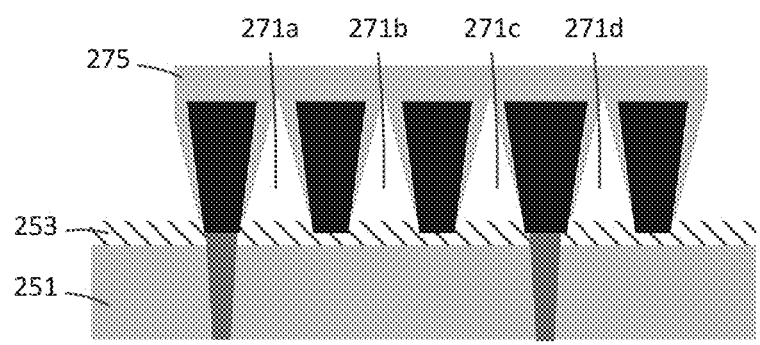
FIG. 17 shows the structure of FIG. 16 after formation of a capping layer.

FIG. 17 shows the structure of FIG. 16 after deposition of a capping layer 275 to enclose air gaps 271a-d so that the air gaps are not affected by subsequent processing. A capping layer is generally formed of a suitable dielectric material, in this example silicon carbon nitride, which pinches off openings at the tops of air gaps and thus seals air gaps so that they remain air-filled.

Figure 18:
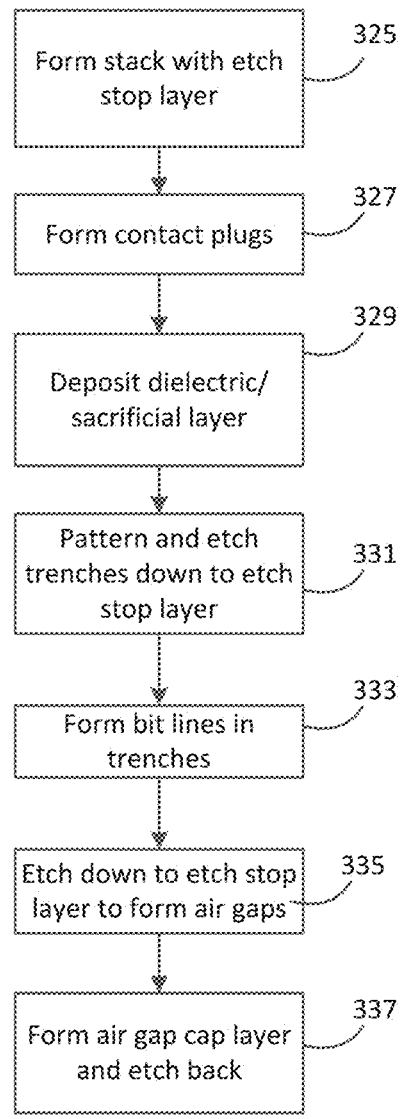
FIG. 18 shows steps in forming bit lines according to an example.

FIG. 18 illustrates process steps that may be used to make bit lines separated by air gaps. A stack of layers that includes an etch stop layer is formed 325 over substrate (e.g. over a memory substrate containing NAND memory strings with contact areas at ends of NAND strings). For example, three dielectric layers (e.g. SiO2/SiN/SiO2) may be deposited with the middle dielectric (SiN) layer acting as an etch stop layer. Silicon nitride may be deposited by PVD, or CVD deposition followed by annealing, or other suitable method. Contact plugs are then formed 327 so that they extend above the upper surface of the etch stop layer. A dielectric layer, which may be a sacrificial layer, is then deposited 329 over the stack and the contact plugs. Patterning and etching are then used to form trenches down to the stop layer 331, which stops trench formation at a uniform depth. Bit lines are then formed in trenches 333. Where (optional) air gaps are desired, another etch may be performed 335 to remove sacrificial material from between bit lines down to the etch stop layer. This provides air gaps of uniform depth. Subsequently, a cap layer is deposited and etched back 337 so that air gaps are enclosed and are protected from subsequent processing.

CONCLUSION

Although the various aspects have been described with respect to examples, it will be understood that protection within the full scope of the appended claims is appropriate.

It is claimed:

1. A method of forming a structure, comprising:
   forming a first dielectric layer;
   subsequently forming a second dielectric layer over the first dielectric layer;
   subsequently forming a third dielectric layer over the second dielectric layer;
   subsequently forming a contact plug that extends through the first, second, and third dielectric layers;
   subsequently depositing a fourth dielectric layer on the third dielectric layer and on the contact plug;
   patterning the fourth dielectric layer and the third dielectric layer such that one or more trenches are formed where one or more conductive lines are to be located, the one or more trenches extending into the second dielectric layer to a depth that provides adhesion between the second dielectric layer and subsequently formed conductive lines and exposing the contact plug;
   subsequently forming the conductive lines in the one or more trenches;
   subsequently removing the third and fourth dielectric layers between the conductive lines thereby forming air gaps between the conductive lines; and
   subsequently depositing a fifth dielectric layer on the conductive lines, the fifth dielectric capping the air gaps.

2. The method of claim I. wherein the forming of the contact plug comprises:
   (a) forming a contact hole that extends through the first, second, and third dielectric layers;
   (b) subsequently depositing a conductive material in the contact hole and overlying a surface of the third dielectric layer; and
   (c) subsequently performing planarization to remove the conductive material overlying the surface of the third dielectric layer and remove an upper portion of the third dielectric layer leaving a lower portion of the third dielectric layer.

3. The method of claim 1 wherein the second dielectric layer is formed of silicon nitride, the third dielectric layer is formed of silicon oxide, and the fourth dielectric layer is formed of silicon oxide.

4. The method of claim 3 wherein the second dielectric layer is a layer deposited by Physical Vapor Deposition (PVD).

5. A method of forming bit lines in a NAND memory die, comprising:
   forming a dielectric layer;
   subsequently forming an etch stop layer over the dielectric layer;
   subsequently forming a first sacrificial layer over the etch stop layer;
   subsequently forming a contact plug that extends through the sacrificial layer, the etch stop layer, and the dielectric layer;
   subsequently forming a second sacrificial layer on the first sacrificial layer and on the contact plug;
   etching a plurality of trenches through the first sacrificial layer, the second sacrificial layer, and into the etch stop layer, stopping at a level that is lower than an upper surface of the etch stop layer, thereby providing a recessed surface of the etch stop layer for the subsequently formed bit lines to adhere to, and thereby exposing the contact plug;
   subsequently forming bit lines in the plurality of trenches; and
   subsequently removing the first and second sacrificial layers to form air gaps.

6. The method of claim 5 wherein the etching extends trenches below an upper surface of the contact plug by a distance that is greater than a thickness of the first sacrificial layer.

7. The method of claim 5 further comprising depositing a capping layer to cap the air gaps.

8. The method of claim 7 wherein the dielectric layer is formed of silicon oxide, the etch stop layer is formed of silicon nitride, the first and second sacrificial layers are formed of silicon oxide, and the capping layer is formed of silicon carbon nitride.

9. The method of claim 8 wherein the etching is selective to silicon oxide over silicon nitride.

* * * * *